(12) United States Patent
Kang

(10) Patent No.: US 12,120,858 B2
(45) Date of Patent: Oct. 15, 2024

(54) PICTURE GENERATION APPARATUS USING HEATSINK DISSIPATING SYSTEM

(71) Applicant: HYUNDAI MOBIS CO., LTD., Seoul (KR)

(72) Inventor: Hyun Woo Kang, Seongnam-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 18/348,560

(22) Filed: Jul. 7, 2023

(65) Prior Publication Data
US 2024/0130094 A1  Apr. 18, 2024

(30) Foreign Application Priority Data
Oct. 5, 2022 (KR) .................. 10-2022-0127231

(51) Int. Cl.
  *H05K 7/20* (2006.01)
  *G02B 27/01* (2006.01)
(52) U.S. Cl.
  CPC ..... *H05K 7/20963* (2013.01); *G02B 27/0101* (2013.01); *G02B 2027/0152* (2013.01)
(58) Field of Classification Search
  CPC ........ G02B 27/0101; G02B 2027/0152; H05K 7/20963
  See application file for complete search history.

(56) References Cited

U.S. PATENT DOCUMENTS

| | | | | |
|---|---|---|---|---|
| 6,007,209 A | * | 12/1999 | Pelka | G02F 1/133603 362/97.3 |
| 9,360,703 B2 | * | 6/2016 | Hong | G02F 1/133603 |
| 2006/0103774 A1 | * | 5/2006 | Han | G02F 1/133385 349/58 |
| 2006/0292461 A1 | * | 12/2006 | Shives | G02F 1/133382 430/7 |
| 2013/0162506 A1 | * | 6/2013 | Kim | F21V 29/50 345/82 |
| 2023/0350198 A1 | * | 11/2023 | Hori | B60K 35/00 |

* cited by examiner

*Primary Examiner* — Kevin Quarterman
(74) *Attorney, Agent, or Firm* — NovoTechIP International PLLC

(57) ABSTRACT

A picture generation apparatus using a heat sink dissipating system is disclosed. An embodiment of the present disclosure provides a picture generation apparatus including a PCB on which one or more light sources are disposed; a funnel configured to focus light of the light sources emitted from the PCB, and to reflect the focused light of the light sources to a user; and a heat sink comprising a cup-shaped accommodating part to accommodate the PCB and the funnel, and a polygonal flange part formed on an end thereof.

10 Claims, 3 Drawing Sheets

PICTURE GENERATION APPARATUS USING HEATSINK DISSIPATING SYSTEM

CROSS-REFERENCE TO RELATED APPLICATIONS

The present application claims priority to Patent Application No. 10-2022-0127231, filed on Oct. 5, 2022 in Korea, the entire contents of which are incorporated herein by reference.

TECHNICAL FIELD

The present disclosure relates to a picture generation unit using a heat sink dissipating system.

BACKGROUND

The content described in this section merely provides background information on the present disclosure and does not constitute the prior art.

A head-up display (HUD) is a device that allows a driver to see various pieces of information such as vehicle speed, navigation information, or the amount of fuel of a vehicle by illuminating a windshield of the vehicle. The driver may easily receive various pieces of information related to the driving of the vehicle along with information on an expected driving direction and an obstacle in front, using the head-up display. Therefore, the driver may keep his or her eyes forward with little dispersion of viewpoints while driving.

The head-up display may include a picture generation unit (PGU) that emits an image related to vehicle driving information.

The picture generation unit includes a Liquid Crystal Display (LCD), a plurality of diffusers, a funnel, a Light Emitting Diode (LED), a Metal Core Printed Circuit Board (MC PCB), a Thermal Interface Material (TIM), and a heat sink. Here, the heat sink functions to take heat from a system which generates heat and dissipates the heat to the surroundings based on a material and a structure specific to heat conduction and radiation.

A conventional heat sink occupies approximately 10 to 15% of the total weight of the head-up display. Therefore, there is a need to reduce the total weight of the head-up display by improving the weight of the heat sink.

The conventional heat sink is manufactured based on a limited manufacturing method using a single material. For example, the conventional heat sink is made through an aluminum die casting process. Here, the aluminum die casting process is the process of manufacturing a product by injecting an aluminum alloy into a die mounted on a die casting machine at high pressure. However, the aluminum die casting process is problematic in that the manufacturing costs of production equipment and the die are high, and the number of products that may be manufactured per hour is small. Further, there is a problem in that the thermal conductivity of the aluminum alloy is low and thereby heat may not be effectively dissipated.

SUMMARY

In view of the above, the present disclosure provides a picture generation unit using a heat sink dissipating system, which can improve the weight of a heat sink and reduce the total weight of a head-up display.

According to an embodiment, in a picture generation unit using a heat sink dissipating system, a heat sink can be manufactured through a press method, thereby reducing the manufacturing costs of production equipment and a die, and increasing the number of products that may be manufactured per hour.

According to an embodiment, in a picture generation unit using a heat sink dissipating system, a heat sink can be manufactured using an AL1050 material, thereby securing high thermal conductivity.

The objectives to be achieved by the present disclosure are not limited to the above-mentioned objectives, and other objectives which are not mentioned will be clearly understood by those skilled in the art from the following description.

An embodiment of the present disclosure provides a picture generation apparatus, which uses a heat sink dissipating system, including a PCB on which one or more light sources are disposed; a funnel configured to focus light of the light sources emitted from the PCB, and to reflect the focused light of the light sources to a user; and a heat sink comprising a cup-shaped accommodating part to accommodate the PCB and the funnel, and a polygonal flange part disposed (or formed) on an end thereof.

According to an embodiment, a picture generation unit using a heat sink dissipating system is advantageous in that the weight of a heat sink can be improved and the total weight of a head-up display can be reduced.

According to an embodiment, a picture generation unit using a heat sink dissipating system is advantageous in that a heat sink is manufactured through a press method, thereby reducing the manufacturing costs of production equipment and a die, and increasing the number of products that may be manufactured per hour.

According to an embodiment, a picture generation unit using a heat sink dissipating system is advantageous in that a heat sink is manufactured using an AL1050 material, thereby securing high thermal conductivity.

DETAILED DESCRIPTION

Figure 1:
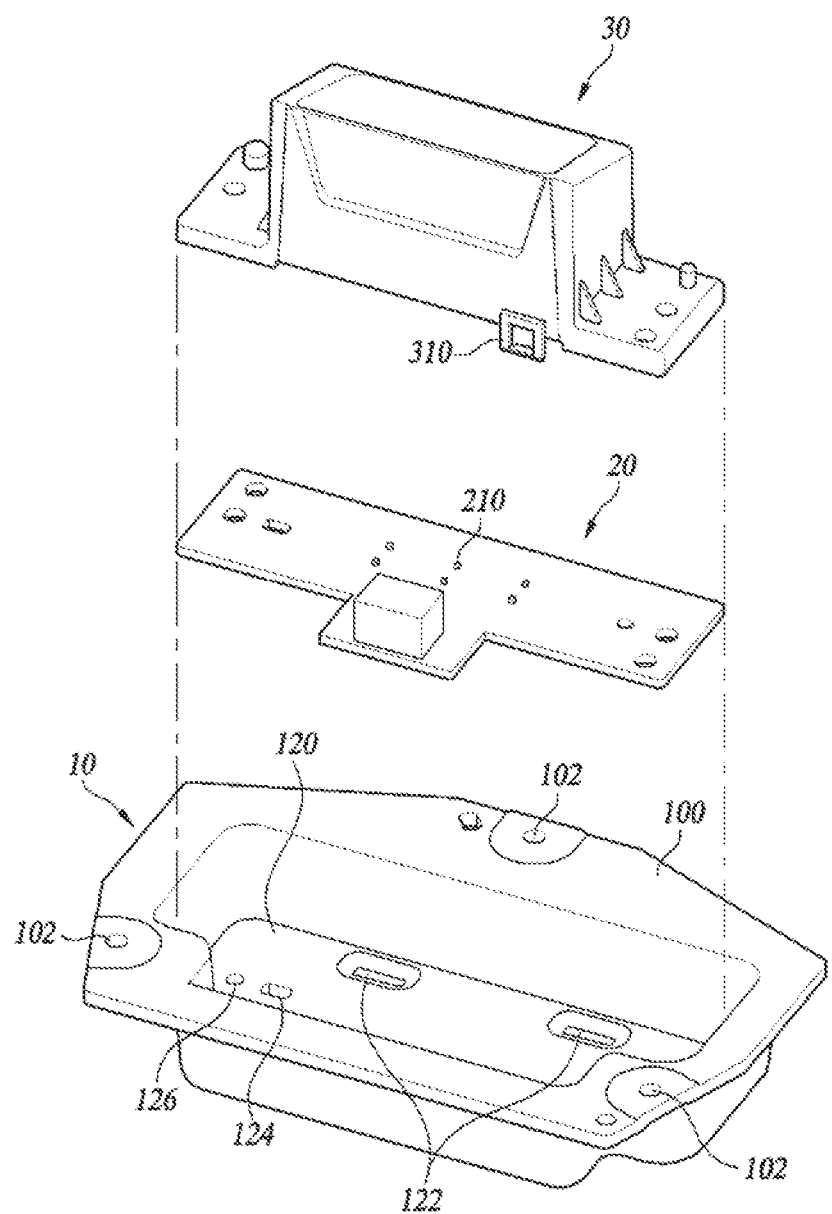
FIG. 1 is an exploded perspective view illustrating a picture generation unit according to an embodiment of the present disclosure.

Hereinafter, some exemplary embodiments of the present disclosure will be described in detail with reference to the accompanying drawings. In the following description, like reference numerals preferably designate like elements, although the elements are shown in different drawings. Further, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout this specification, when a part 'includes' or 'comprises' a component, the part is meant to further include other components, not to exclude thereof unless specifically stated to the contrary.

In the description of the present disclosure, terms "upper" and "top" are defined as a +z-axis direction, and terms "lower" and "bottom" are defined as a −z-axis direction. The "upper surface" means a case where the normal vector of a corresponding surface is in the +z-axis direction, while the "lower surface" means a case where the normal vector of a corresponding surface is in the −z-axis direction.

FIG. 1 is an exploded perspective view illustrating a picture generation unit according to an embodiment of the present disclosure.

Figure 2:
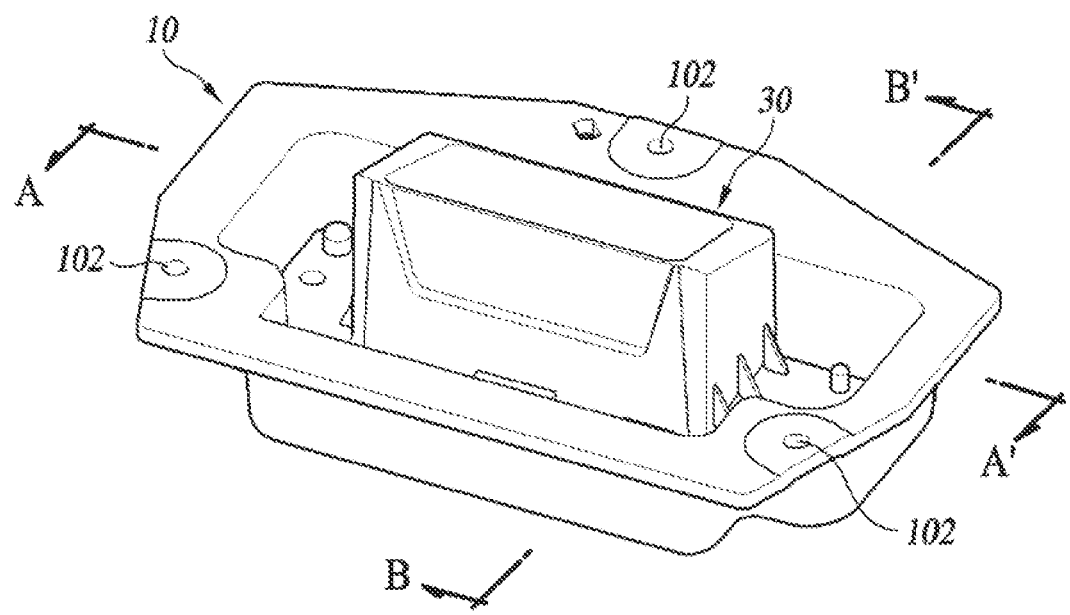
FIG. 2 is a perspective view illustrating the picture generation unit according to an embodiment of the present disclosure.

FIG. 2 is a perspective view illustrating the picture generation unit according to an embodiment of the present disclosure.

Referring to FIG. 1 and FIG. 2, the picture generation unit may include a heat sink 10, a PCB 20, and a funnel 30.

The picture generation unit may further include a Liquid Crystal Display (not shown) and a plurality of diffusers (not shown).

The picture generation unit may further include a thermal interface material (not shown) that is disposed under the PCB 20 to transfer heat generated from the PCB 20. The thermal interface material may be interposed between the PCB 20 and the heat sink 10. In this regard, the thermal interface material may be a composite material based on metal such as aluminum and a thermal conductive filler (i.e. filling material) such as ceramic or carbon. The thermal interface material may be a heat dissipation adhesive. The heat dissipation adhesive may be attached to an object to dissipate heat, and may perform a heat dissipating function.

The heat sink 10 is disposed on one side of the picture generation unit and dissipates heat generated from the picture generation unit and the PCB 20. The heat sink 10 may be configured to be in contact with a portion of the lower surface of the picture generation unit or surround a portion of the lower surface and the side surface thereof. The heat sink 10 may remove heat generated from the picture generation unit and a main body of the head-up display.

A conventional heat sink is manufactured using, for example, the ALDC12 material and has relatively low thermal conductivity. In an embodiment of the present disclosure, the heat sink 10 may be formed of an AL1050 material. In this regard, the AL1050 material refers to an aluminum material belonging to a 1000 series. Aluminum has a series corresponding to whether it is alloyed with other materials, and the series may be divided into 1000 to 9000 series. Among the 1000 to 9000 series, the 1000 series is a series in which the aluminum content is about 99 to about 99.9%. Therefore, because the heat sink 10 has a high content of aluminum material, it has excellent electrical conductivity, thermal conductivity, and corrosion resistance. The heat sink 10 has the thermal conductivity within about 140 to about 180 W/mK, for example. Further, the weight of the heat sink 10 may be an improved weight compared to the weight of the conventional heat sink. This is because AL1050 is lighter in weight than the aluminum alloy. The weight of the heat sink 10 may be 80 g, for example. Here, g is a gram representing weight.

The conventional heat sink includes a plurality of heat dissipation fins. The heat dissipation fin may be disposed at any one place of the heat sink so as to widen a heat radiation surface. However, when assembling the conventional heat sink, the heat dissipation fin may cause friction with or damage to a peripheral part. In contrast, the heat sink 10 of this embodiment may have a finless structure in which there are no heat dissipation fins.

The heat sink 10 may be formed based on a deep drawing process to effectively dissipate heat generated from the inside of the picture generation unit and to prevent the light leakage of a light source from occurring in the PCB 20. Here, the deep drawing process is a process in which a blank of a flat material is introduced into a die to form a punch-shaped container. Here, the die may be a double acting die. The heat sink 10 may continuously perform the deep drawing process using a plurality of dies. In the case of continuously performing the deep drawing process, it is possible to simultaneously form a bent portion on the blank of the flat material.

The heat sink 10 may be subjected to an anodizing surface treatment. Here, the anodizing surface treatment method is a surface treatment method that makes a thin oxide film on the surface of metal to protect the inside of the metal. The heat sink 10 is subjected to the anodizing surface treatment, so that it is possible to prevent the heat sink from being corroded or oxidized due to heat generated from the inside of the picture generation unit. Here, the surface treatment method of the heat sink 10 is not limited to the anodizing surface treatment method. The surface treatment method of the heat sink 10 may use a surface treatment method corresponding to the type of a vehicle, the design specification of the picture generation unit, the shape of the heat sink 10, or the like. For example, the heat sink 10 may be subjected to the surface treatment using the aluminum surface treatment method such as a hard-anodizing treatment or a Teflon treatment method.

The heat sink 10 may include an accommodating part 120 and a flange part 100.

The shape of the accommodating part 120 may be a cup shape formed using the deep drawing method. The accommodating part 120 may define an accommodating space that may accommodate the PCB 20 and the funnel 30. The accommodating part 120 may have a cross-sectional shape corresponding to a '凸'-shaped punch, for example. However, the cross-sectional shape of the accommodating part 120 is not limited thereto. The cross-sectional shape of the accommodating part 120 may be changed to correspond to the cross-sectional shapes of the PCB 20 and the funnel 30. For example, when the PCB 20 and the funnel 30 have rectangular cross-sections, the blank may be pressed using a punch having the rectangular cross-section. Using this, the accommodating part may be formed to have a rectangular cross-section capable of accommodating the PCB 20 and the funnel 30.

The accommodating part 120 may include a first hole part 124 and a second hole part 126. The first hole part 124 and the second hole part 126 may be disposed in the lower end surface of the accommodating part 120. The first hole part 124 and the second hole part 126 will be described in detail with reference to FIG. 3.

The accommodating part 120 may include a plurality of embossing portions 122. The embossing portions 122 may be arranged in a predetermined pattern on the lower end surface of the accommodating part 120. The embossing portions 122 may be disposed on the lower end surface of the accommodating part 120 and may bulge in a direction outward from the lower end surface. The embossing portion 122 may accommodate a fixing member 310 of the funnel 30. The embossing portion 122 may increase the cross-sectional area of the lower end surface of the heat sink 10 to increase the heat dissipating effect. The embossing portion 122 may be formed using the embossing process. Here, the embossing process is the process which locally causes plastic deformation in the shape of a protrusion while maintaining the thickness of the blank. In the case of performing the embossing process, the hardness of the corresponding portion may be increased. The embossing portion 122 may be formed to have a depth and vertical/horizontal diameters corresponding to the shape of the fixing member 310 of the funnel 30. The number of the embossing portions 122 may correspond to that of the fixing members 310.

When performing the deep drawing process, a part receiving compressive and frictional forces between a blank holder and the die is called a flange. The flange part 100 may be the flange part of the heat sink 10 manufactured through the deep drawing method.

The flange part 100 may have an octagonal cross-section. However, without being limited thereto, the flange part 100 may have a polygonal cross-section corresponding to the cross-section of another member assembled or connected thereto.

A plurality of holes 102 may be disposed in the flange part 100 to assemble or connect the heat sink 10 with or to another member. In this regard, the plurality of holes 102 may be formed using a tap process or a burring process. The periphery of the plurality of holes 102 may be convex toward the upper surface of the heat sink 10 using the embossing process. The periphery of the plurality of holes 102 may undergo plastic deformation to increase the hardness. The plurality of holes 102 may be holes that are formed to conjoin or assemble the heat sink 10 with another member. When the heat sink 10 is assembled with another member, the convex shape of the periphery of the plurality of holes 102 may cause a step difference between the flange part 100 and another member. Here, the step difference between the flange part 100 and another member may provide a space through which heat inside the heat sink 10 is discharged to the outside or outside air is introduced.

Figure 3:
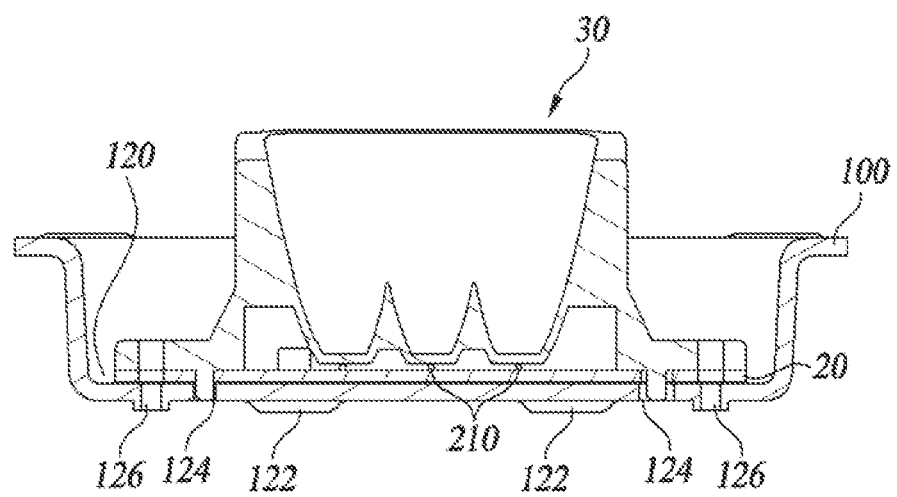
FIG. 3 is a cross-sectional view taken along line A-A' to illustrate the picture generation unit according to an embodiment of the present disclosure.

FIG. 3 is a cross-sectional view taken along line A-A' to illustrate the picture generation unit according to an embodiment of the present disclosure.

Referring to FIG. 1 and FIG. 3, the PCB 20 may be disposed in the accommodating space within the heat sink 10. The PCB 20 may be disposed on the lower end surface of the heat sink 10. One or more light sources 210 may be disposed on the PCB 20. With respect to the travelling path of light emitted from the light source, the PCB 20 may be disposed in the rear of the funnel 30. The PCB 20 may be disposed to be in contact with at least a portion of the funnel 30. The PCB 20 may include holes corresponding to the first hole part 124 and the second hole part 126 of the accommodating part 120. The PCB 20 may be secured between the funnel 30 and the heat sink 10 using a plurality of holes (not shown) corresponding to the first hole part 124 and the second hole part 126. Here, the light source 210 is a light emitting member, and may be disposed on the PCB 20. A plurality of light sources 210 may be provided. The light source 210 may be an LED. The plurality of light sources 210 may be disposed in a predetermined pattern on the PCB 20. Light emitted from the light source 210 may pass through the funnel 30 and the diffuser (not shown) and then may be incident on the rear of the LCD (not shown). The LCD emits an image using light emitted from the light source 210. Here, the diffuser diffuses the light emitted from the light source 210 so that it is evenly incident to the rear of the LCD. In this regard, the LCD emits an image using light emitted from the light source.

The first hole part 124 may be disposed in the lower end surface of the accommodating part 120. The first hole part 124 may include a slot hole and a short hole. The first hole part 124 includes at least one slot hole. The first hole part 124 may include at least one slot hole to permit the assembly tolerance of the PCB 20 and the funnel 30 accommodated in the accommodating part 120. Here, the horizontal and vertical lengths of the slot hole may be preset lengths.

The first hole part 124 is a hole corresponding to a guide part (not shown) formed on the lower end surface of the funnel 30 to extend outward. Here, the guide part may be formed to fix the funnel and the PCB to the lower end surface of the heat sink. The guide part may have a cylindrical shape having a preset diameter and height. The diameter and height of the guide part may be a diameter and height corresponding to the slot hole and the short hole. Here, the positions of the slot hole and the short hole may be changed.

The second hole part 126 may be a plurality of holes for fixing the PCB 20 and the funnel 30 in the accommodating part 120. The second hole part 126 may be the hole formed using the burring process. A conventional hole is formed based on a screw tapping process. Here, the screw tapping process is a four-stage process of performing injection, drilling, tapping, and M3 bolt fastening processes. Among the four stages, the drilling and tapping processes are referred to as post-processing processes. On the other hand, the second hole part 126 is formed based on a self-tapping screw process. The self-tapping screw process is a two-stage process of performing pressing and M3 bolt self-tapping screw fastening processes. That is, the second hole part 126 may be formed without performing the post-processing process. Therefore, the second hole part 126 may be formed through the two-stage process instead of the MCT process, i.e. the four-stage process for processing precision parts. This has the effect of improving the process and reducing the cost.

Figure 4:
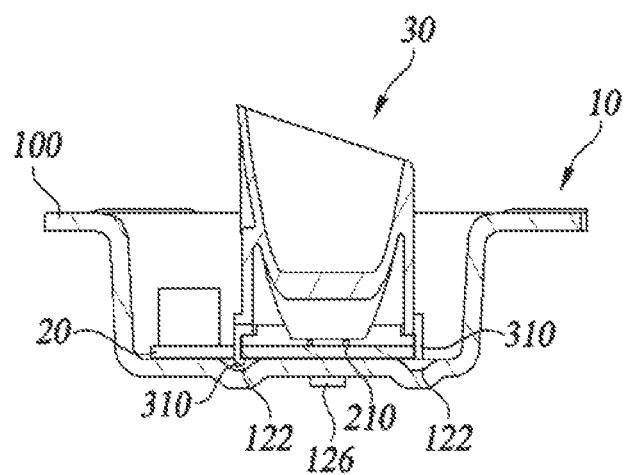
FIG. 4 is a cross-sectional view taken along line B-B' to illustrate the picture generation unit according to an embodiment of the present disclosure.

FIG. 4 is a cross-sectional view taken along line B-B' to illustrate the picture generation unit according to an embodiment of the present disclosure.

Referring to FIG. 1 and FIG. 4, the funnel 30 may be disposed on the front (or upper surface) of the PCB 20 on which the light source 210 is disposed. The funnel 30 may be disposed on the rear (or lower surface) of the diffuser (not shown) or the LCD (not shown). A portion of the funnel 30 may be disposed to contact the lower end surface of the accommodating part 120. The funnel 30 guides the travelling path of light so that light emitted from the light source 210 is uniformly incident on the diffuser and the LCD. In order to guide the travelling path of the light emitted from the light source 210, the inside of the funnel 30 may be formed in the shape of a cup. The upper end of the funnel 30 may have a tapered cross-section. The plurality of fixing members 310 may be disposed on the lower end surface of the funnel 30. Each of the plurality of fixing members 310 may have a hook shape. The plurality of fixing members 310 may be formed to fix the funnel 30, the PCB 20, and the thermal interface material (not shown) to each other. Although the number of the plurality of fixing members 310 is shown as two in FIG. 4, the present disclosure is not limited thereto. The plurality of fixing members 310 may be two or more. When the funnel 30 contacts the lower end surface of the heat sink 10, some of the plurality of fixing members 310 may be located inside the plurality of embossing portions 122.

According to an embodiment, the picture generation unit using the heat sink dissipating system is advantageous in that the weight of the heat sink 10 can be improved and the total weight of the head-up display (not shown) can be reduced.

According to an embodiment, the picture generation unit using the heat sink dissipating system is advantageous in that the heat sink 10 is manufactured through the press method, thereby reducing the manufacturing costs of the production equipment and the die, and increasing the number of products that may be manufactured per hour.

According to an embodiment, the picture generation unit using the heat sink dissipating system is advantageous in that the heat sink 10 is manufactured using the AL1050 material, thereby securing high thermal conductivity.

Although exemplary embodiments of the present disclosure have been described for illustrative purposes, those having ordinary skill in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. A picture generation apparatus comprising:
a printed circuit board (PCB);
one or more light sources disposed on the PCB and configured to emit light;
a funnel configured to focus the light emitted from the one or more light sources and reflect the focused light to a user; and
a heat sink configured to dissipate heat from the PCB, the heat sink comprising (1) an accommodating part shaped to define an accommodating space and having an opening exposing the accommodating space, and (2) a polygonal flange part extending outwardly from the accommodating part and surrounding the opening of the accommodating part, wherein the PCB and the funnel are disposed at the accommodating space of the heat sink.

2. The picture generation apparatus of claim 1, wherein the accommodating part comprises a plurality of embossing portions disposed on a lower end surface of the accommodating part and configured to fix the funnel to the heat sink.

3. The picture generation apparatus of claim 1, wherein the heat sink comprises an aluminum material having an aluminum content of about 99% or more.

4. The picture generation apparatus of claim 1, wherein the heat sink has thermal conductivity ranging between about 140 W/mK to about 180 W/mK.

5. The picture generation apparatus of claim 1, wherein the heat sink has a weight equal to or less than 100 g.

6. The picture generation apparatus of claim 1, wherein the funnel comprises a plurality of fixing members configured to fix the funnel and the PCB to the heat sink.

7. The picture generation apparatus of claim 6, wherein each of the plurality of fixing members has a hook shape.

8. A picture generation apparatus comprising:
a printed circuit board (PCB);
one or more light sources disposed on the PCB and configured to emit light;
a funnel configured to focus the light emitted from the one or more light sources and reflect the focused light to a user; and
a heat sink comprising (1) a cup-shaped accommodating part configured to accommodate the PCB and the funnel, and (2) a polygonal flange part disposed at an end portion of the heat sink,
wherein the accommodating part includes a hole disposed on a lower end surface of the accommodating part and configured to conjoin the funnel and the heat sink.

9. The picture generation apparatus of claim 8, wherein:
the hole comprises a plurality of holes, and
the plurality of holes comprise at least one slot hole configured to permit an assembly tolerance.

10. A picture generation apparatus comprising:
a printed circuit board (PCB);
one or more light sources disposed on the PCB and configured to emit light;
a funnel configured to focus the light emitted from the one or more light sources and reflect the focused light to a user; and
a heat sink comprising (1) a cup-shaped accommodating part configured to accommodate the PCB and the funnel, and (2) a polygonal flange part disposed at an end portion of the heat sink,
wherein the accommodating part further comprises a hole disposed on a lower end surface of the accommodating part and configured to fix the funnel and the PCB to the accommodating part.

* * * * *